(12) United States Patent
Wada et al.

(10) Patent No.: US 8,410,608 B2
(45) Date of Patent: Apr. 2, 2013

(54) INTERCONNECT STRUCTURE DEVICE

(75) Inventors: Makoto Wada, Yokohama (JP); Yuichi Yamazaki, Inagi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 5 days.

(21) Appl. No.: 13/233,312

(22) Filed: Sep. 15, 2011

(65) Prior Publication Data

US 2012/0080796 A1    Apr. 5, 2012

(30) Foreign Application Priority Data

Oct. 5, 2010    (JP) .................................. 2010-226017

(51) Int. Cl.
*H01L 23/48*    (2006.01)

(52) U.S. Cl. ......... 257/762; 257/720; 257/751; 257/774

(58) Field of Classification Search .................. None
See application file for complete search history.

(56) References Cited

U.S. PATENT DOCUMENTS

| | | | |
|---|---|---|---|
| 2002/0160111 A1 * | 10/2002 | Sun et al. | 427/248.1 |
| 2006/0086958 A1 | 4/2006 | Eimori | |
| 2011/0006425 A1 | 1/2011 | Wada et al. | |
| 2012/0080661 A1 | 4/2012 | Saito et al. | |
| 2012/0080662 A1 | 4/2012 | Saito et al. | |

FOREIGN PATENT DOCUMENTS

| | | |
|---|---|---|
| JP | 2006-120730 | 5/2006 |
| JP | 2009-070911 | 4/2009 |
| JP | 2012-054303 | 3/2012 |

OTHER PUBLICATIONS

Kang, Byung Jin, et al., "Monolayer graphene growth on sputtered thin film platinum", Journal of Applied Physics, 106, 2009, 104309-1.

Korean Office Action for Korean Application No. 10-2011-92992 mailed on Nov. 12, 2012.

* cited by examiner

*Primary Examiner* — Kyoung Lee
(74) *Attorney, Agent, or Firm* — Turocy & Watson, LLP

(57) ABSTRACT

According to one embodiment, a device includes an insulating layer with a first trench, a first interconnect layer in the first trench, the first interconnect layer including copper and includes a concave portion, and a first graphene sheet on an inner surface of the concave portion.

15 Claims, 17 Drawing Sheets

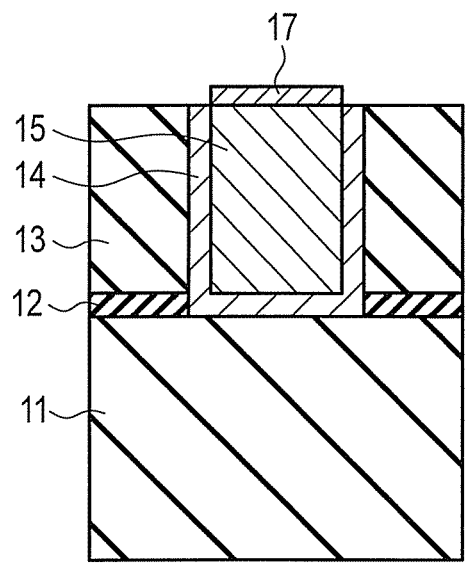
F I G. 3
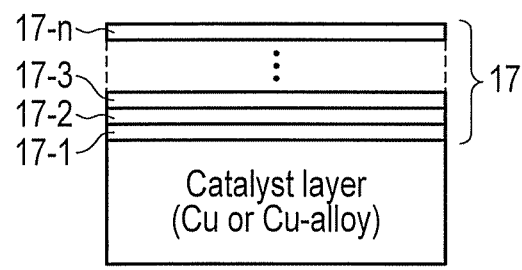
F I G. 4

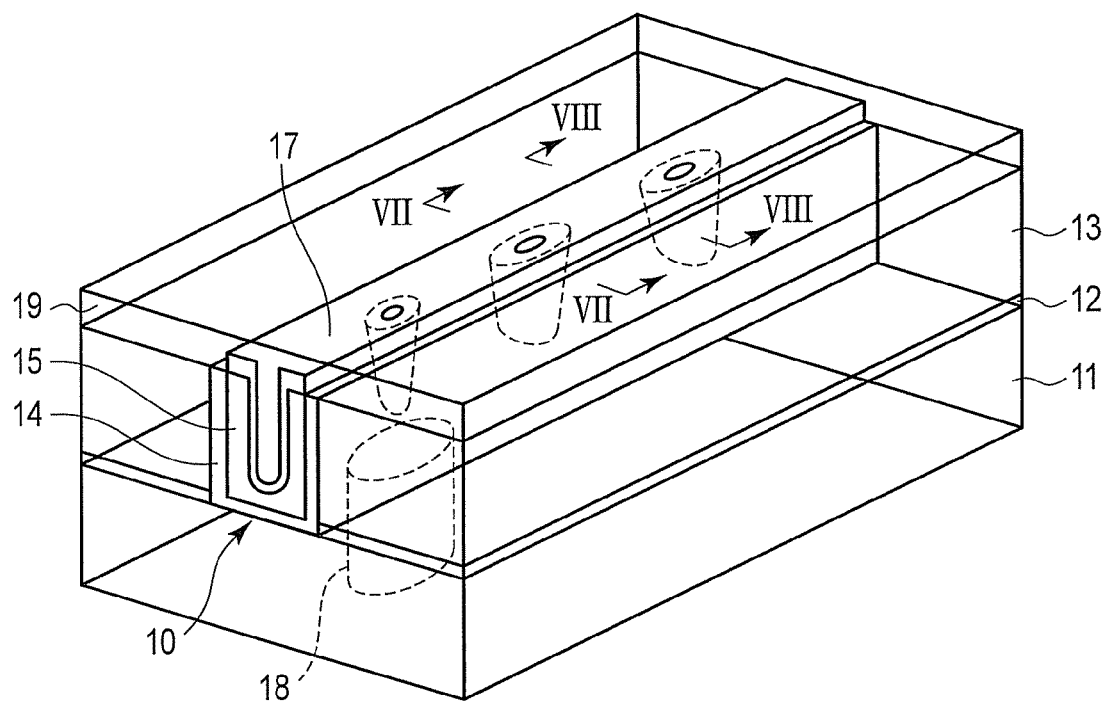
F I G. 6
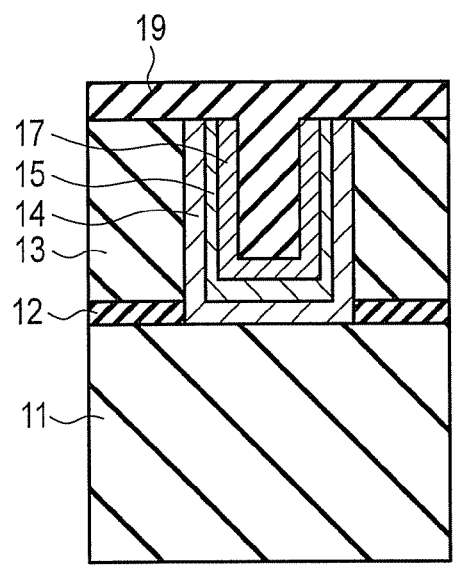
F I G. 7

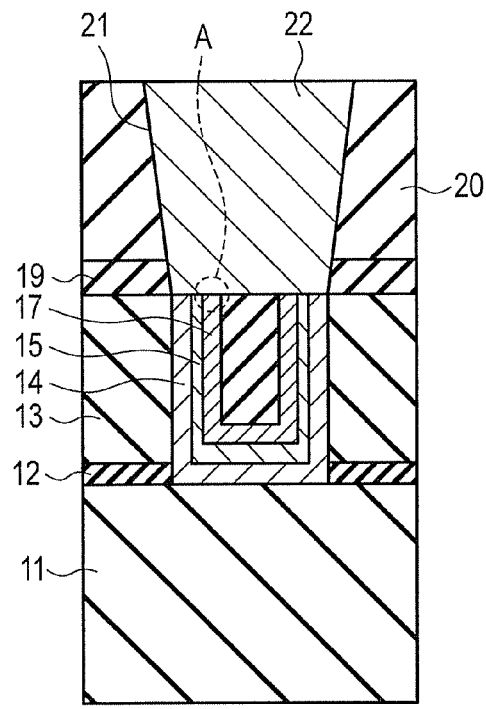
F I G. 10
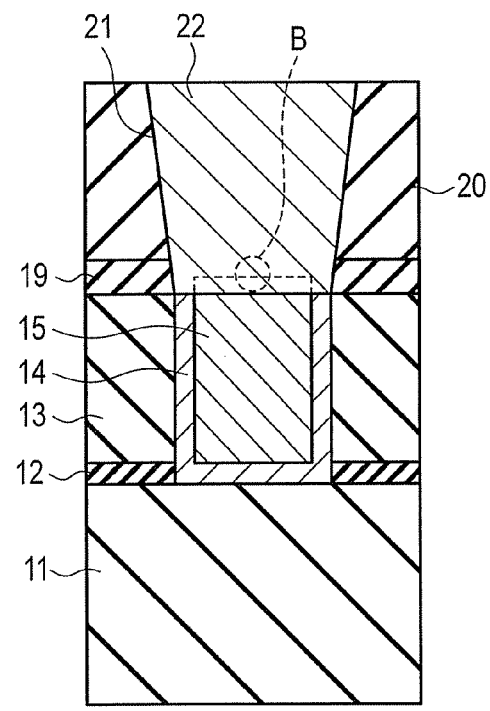
F I G. 11

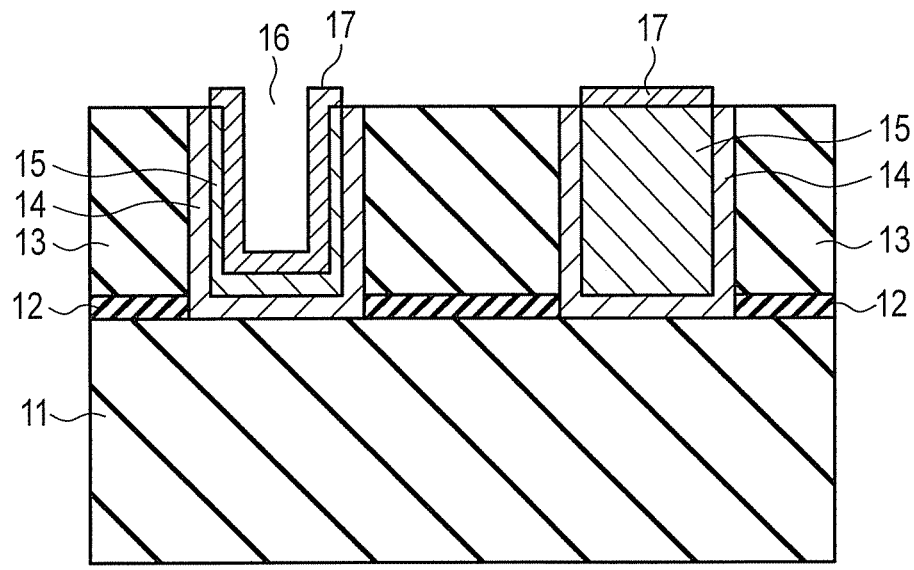
F I G. 17
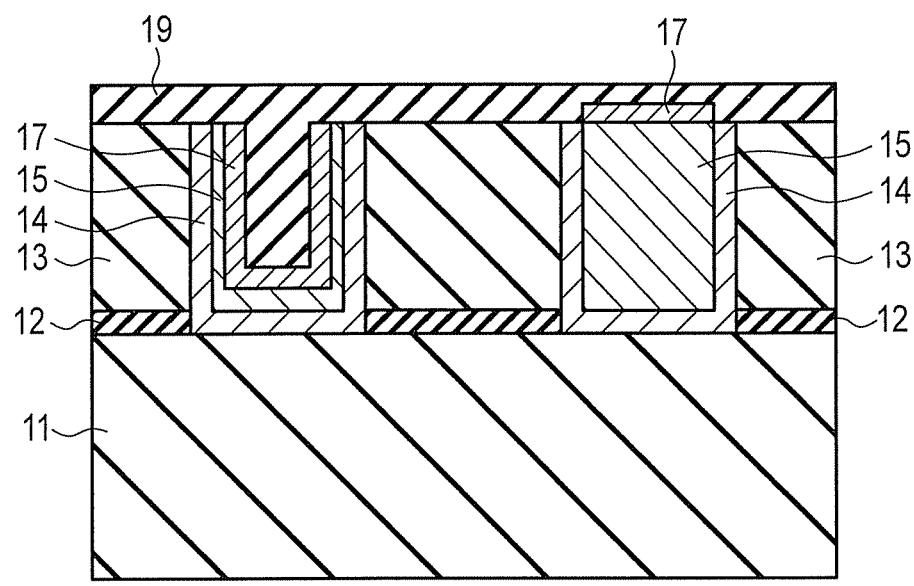
F I G. 18

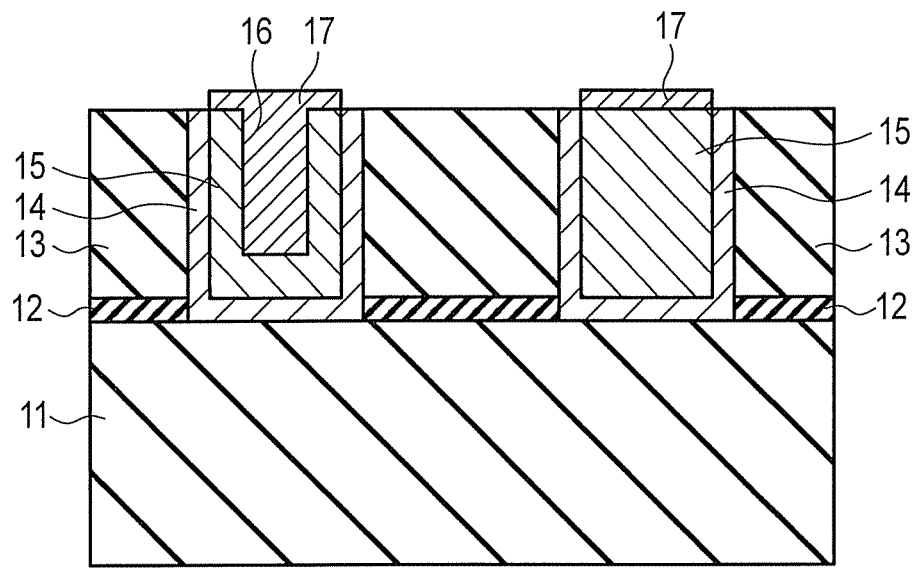
F I G. 19
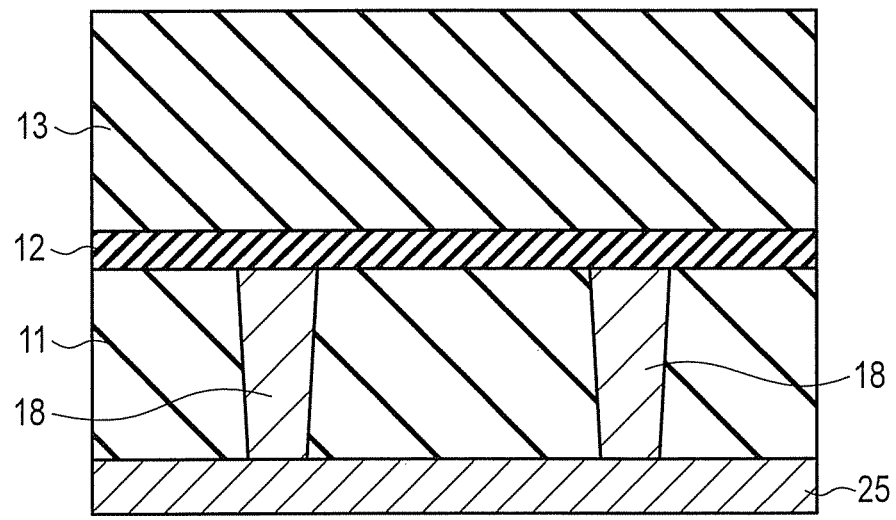
F I G. 20

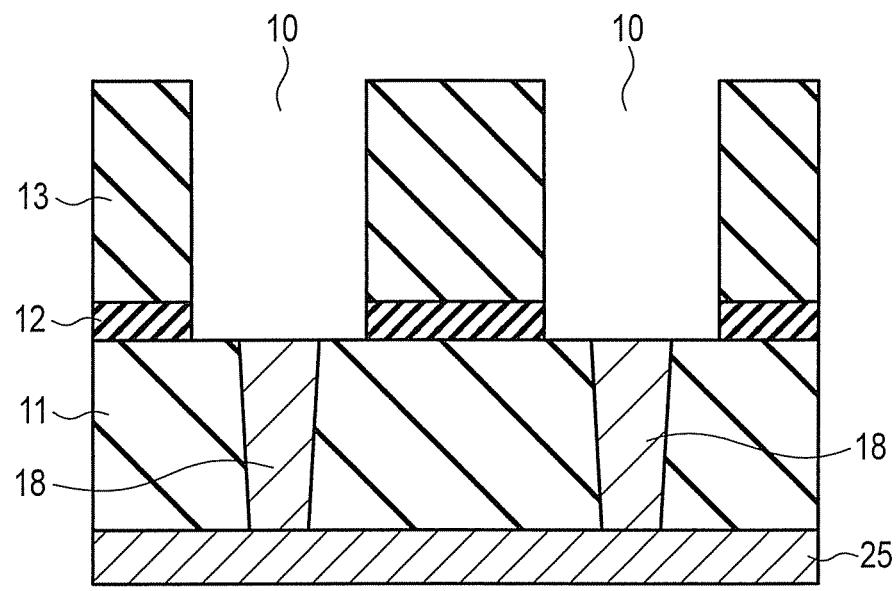
F I G. 21
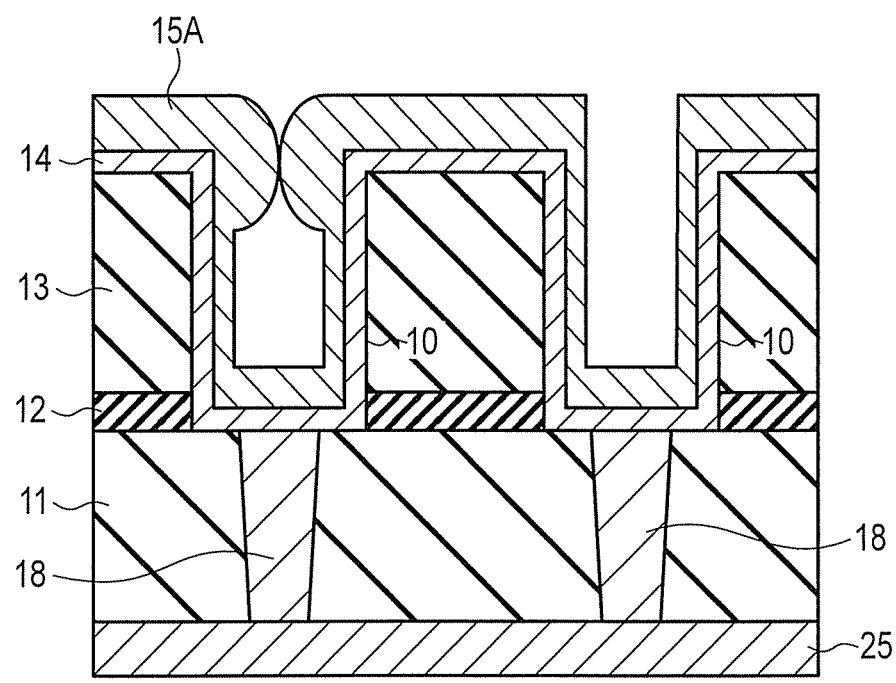
F I G. 22

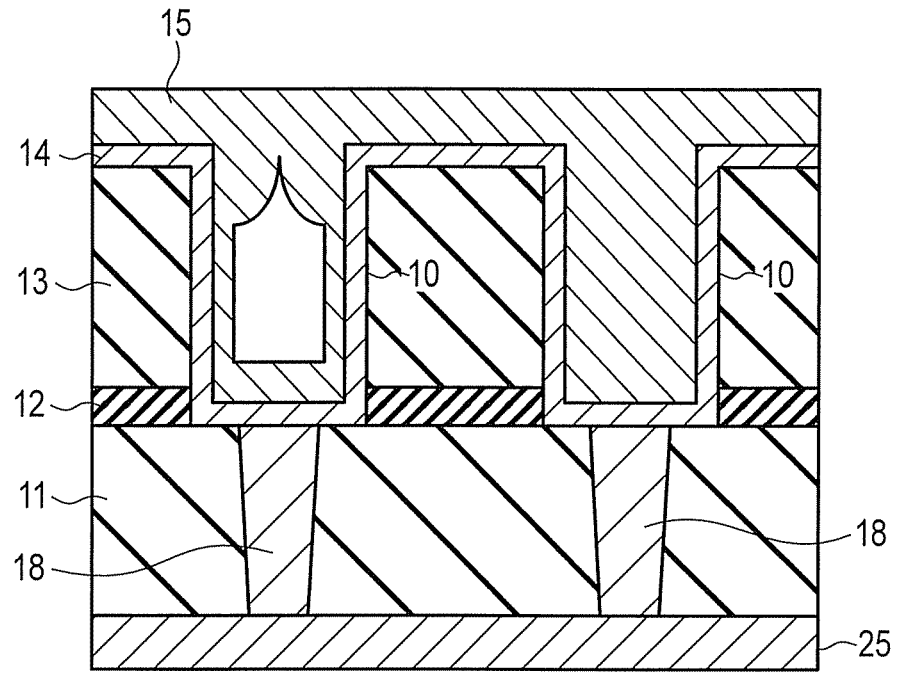
F I G. 23
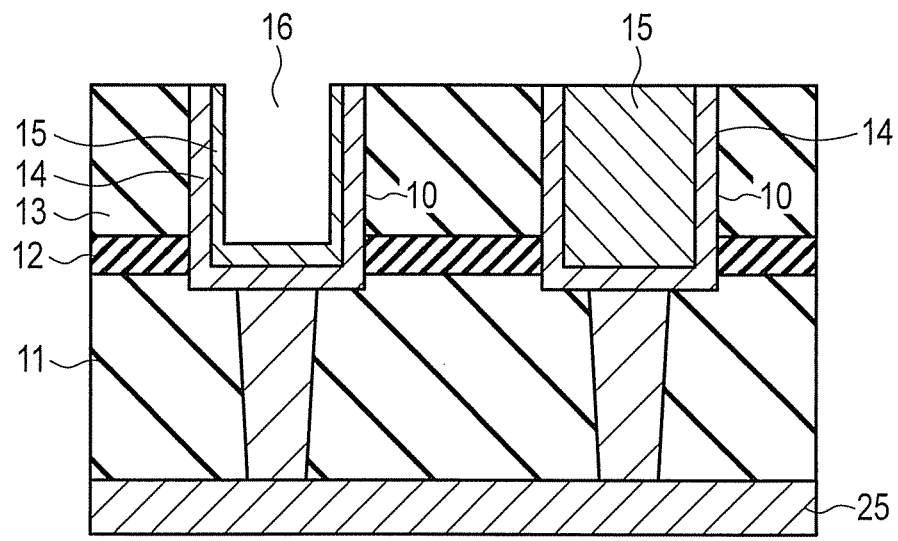
F I G. 24

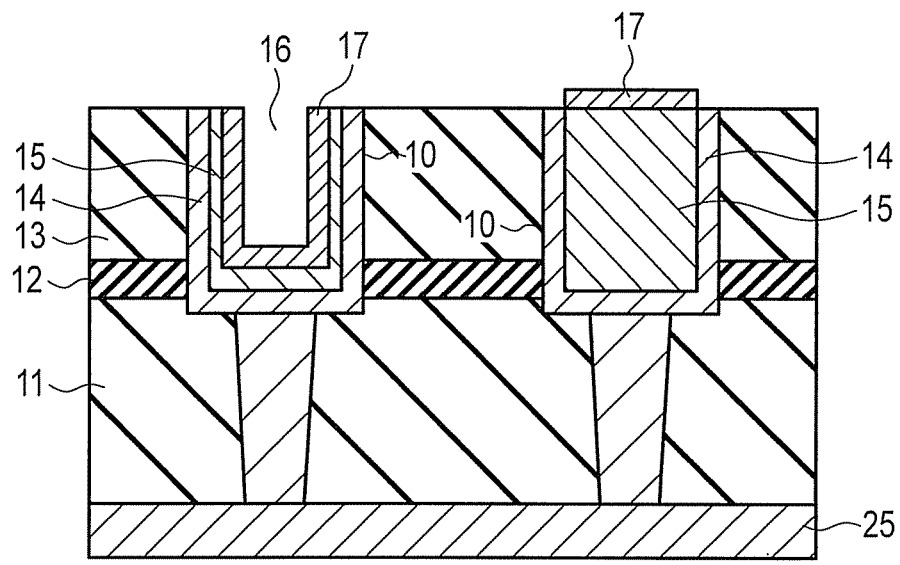
F I G. 25
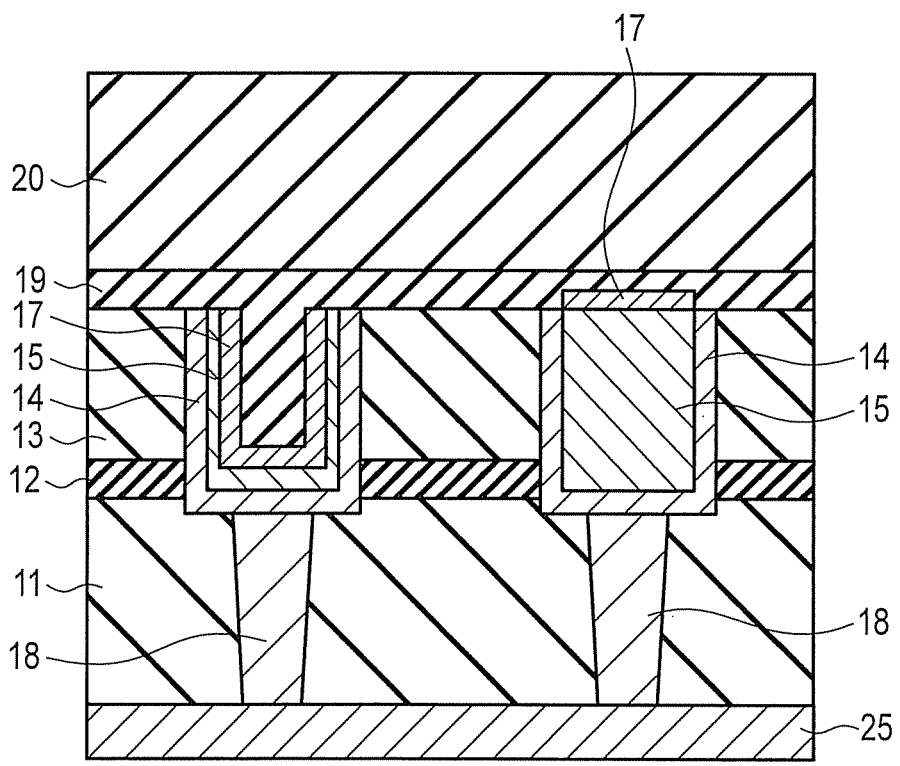
F I G. 26

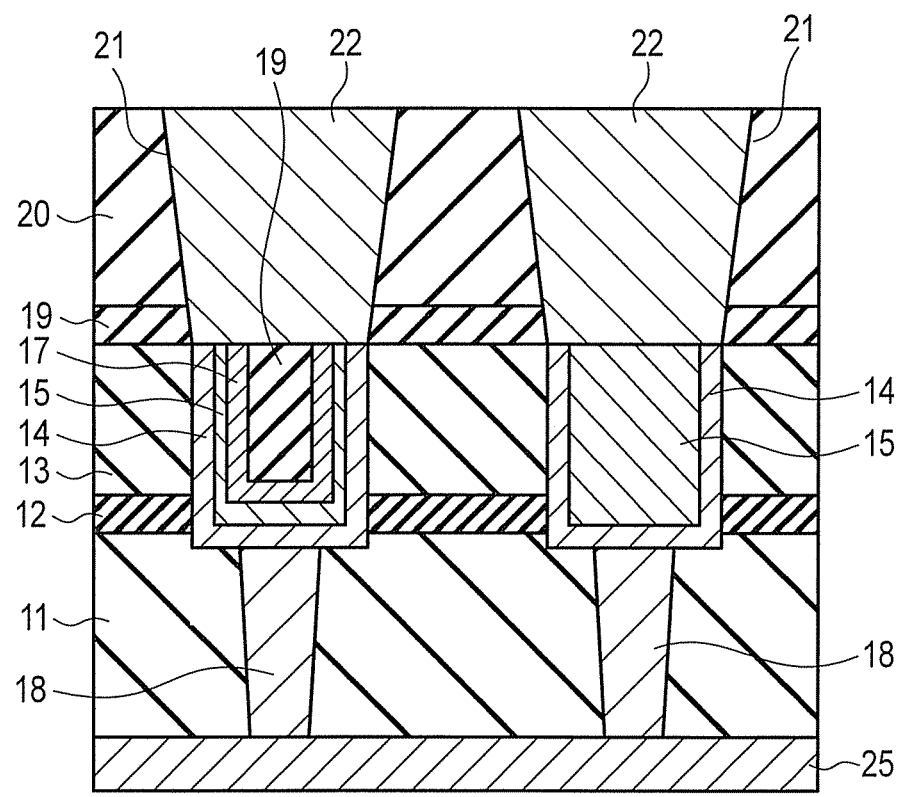
F I G. 27

INTERCONNECT STRUCTURE DEVICE

CROSS-REFERENCE TO RELATED APPLICATIONS

This application is based upon and claims the benefit of priority from prior Japanese Patent Application No. 2010-226017, filed Oct. 5, 2010, the entire contents of which are incorporated herein by reference.

FIELD

Embodiments described herein relate generally to a device.

BACKGROUND

As an interconnect structure of a device, a damascene interconnect structure is known. The structure has the problem that voids occur in interconnects because of miniaturization. Since an interconnect is made thinner in a part where a void is generated, this causes problems such as increase in interconnect resistance, decrease in reliability due to stress migration and electromigration, and discontinuity due to generation of Joule heat, and decreases reliability of interconnects.

BRIEF DESCRIPTION OF THE DRAWINGS

FIG. 3 is a cross-sectional view taken along line of FIG. 1;

FIG. 4 is a diagram illustrating a structure of a graphene layer;

FIG. 6 is a perspective view illustrating a device of a second embodiment;

FIG. 7 is a cross-sectional view taken along line VII-VII of FIG. 6;

FIG. 10 is a cross-sectional view taken along line X-X of FIG. 9;

FIG. 11 is a cross-sectional view taken along line XI-XI of FIG. 9;

FIG. 17 to FIG. 19 are cross-sectional views illustrating a device of a fifth embodiment;

FIG. 20 to FIG. 27 are cross-sectional views illustrating an example of a manufacturing method.

DETAILED DESCRIPTION

In general, according to one embodiment, a device comprises an insulating layer with a first trench; a first interconnect layer in the first trench, the first interconnect layer including copper and comprising a concave portion; and a first graphene sheet on an inner surface of the concave portion.

A device of an embodiment has an interconnect structure including a void. As such an interconnect structure, there is a damascene interconnect structure. In the damascene interconnect structure, since an interconnect layer is formed by embedding conductive material in an interconnect trench, when the width of the interconnect trench is reduced by miniaturization, the conductive material is pinched off in the frontage of the interconnect trench, and a void is formed.

Therefore, in the embodiment, an internal surface of the void is covered with a graphene layer which has low resistance, and the graphene layer performs electronic conduction in a part where the void is formed. Thereby, the embodiment solves problems such as increase in interconnect resistance due to the void, decrease in reliability due to stress migration and electromigration, and discontinuity due to generation of Joule heat, and secures high reliability.

In addition, the graphene layer is formed on a predetermined catalyst. The embodiment proposes that copper (Cu) or copper alloy can be used as the catalyst. Copper or copper alloy is used as material of the damascene interconnect structure, and thus preferable for forming a composite interconnect formed of copper/copper alloy and a graphene layer.

In addition, the graphene layer is formed of one or more graphene sheets formed on the catalyst. The graphene sheet is a basic unit which performs ballistic conduction, and has a characteristic that resistance in one graphene sheet is very low.

In the following embodiment, the term "graphene layer" indicates one or more graphene sheets.

Figure 1:
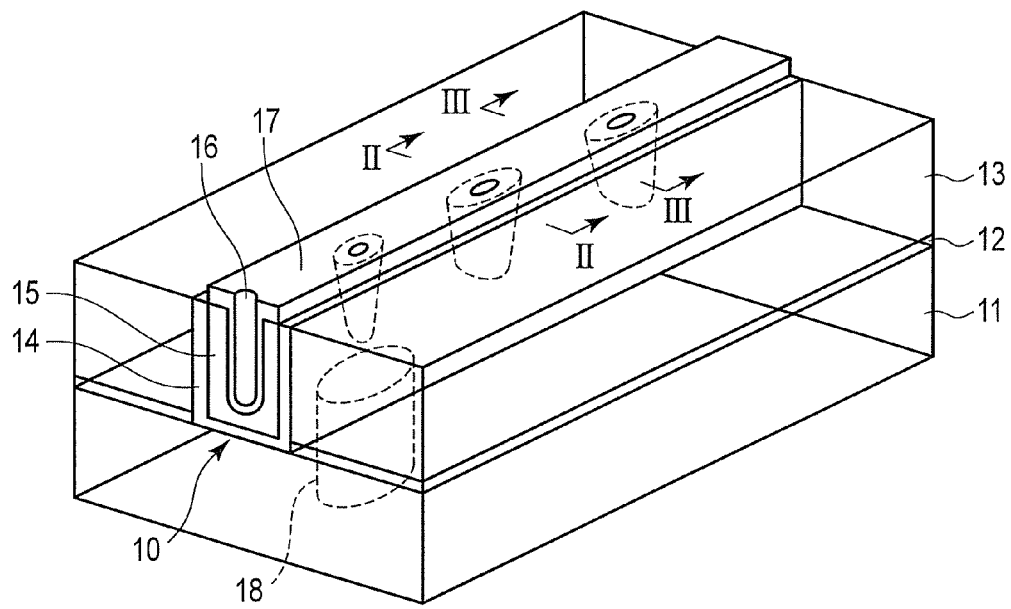
FIG. 1 is a perspective view illustrating a device of a first embodiment.
Figure 2:
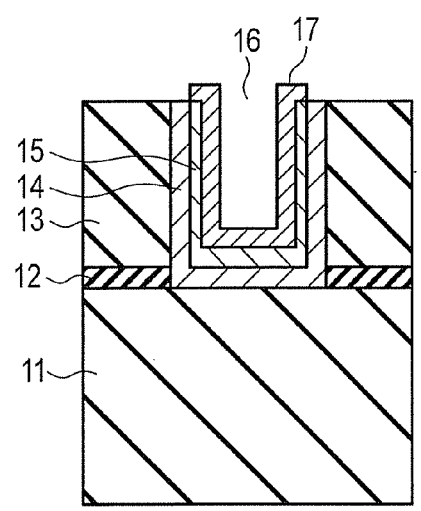
FIG. 2 is a cross-sectional view taken along line II-II of FIG. 1.

FIG. 1 illustrates a device according to a first embodiment. FIG. 2 is a cross-sectional view taken along line II-II of FIG. 1, and FIG. 3 is a cross-sectional view taken along line of FIG. 1.

In this embodiment, a single interconnect which extends in a direction, has a portion with a concave portion as in FIG. 2 and a portion without a concave portion in FIG. 3.

FIG. 2 illustrates an area where a void is formed in a damascene interconnect structure, and FIG. 3 illustrates a normal area (an area where no voids are formed) in the damascene interconnect structure. As described above, the reason why an interconnect includes an area where a void is formed and an area where no voids are formed is that fluctuations in interconnect width occur since the interconnect is made thinner and longer. Specifically, a void is easily generated in areas having a narrow interconnect. In addition, since end portions of an interconnect are tapered, voids are easily generated in end portions of an interconnect.

Holes including such voids are referred to as a "concave portion" in all the following explanations including the present embodiment. This is because all the following embodiments are also applicable to trenches having a whisker shape as well as voids.

Semiconductor devices such as transistors and capacitors formed on a semiconductor substrate are covered with insulating layer (such as silicon oxide) 11. Insulating layer (such as silicon nitride) 12 serving as an etching stopper is formed on insulating layer 11.

Insulating layer 13 which has interconnect trench 10 is formed on insulating layer 12. Barrier metal layer 14 which covers an internal surface of interconnect trench 10 is formed in interconnect trench 10. Interconnect layer (hereinafter referred to as a "copper damascene interconnect layer) 15 which has concave portion 16 in an upper portion thereof and formed of copper or copper alloy is formed on barrier metal layer 14.

Barrier metal layer 14 is formed of a material which has a function of preventing diffusion of the element which forms copper damascene interconnect layer 15, such as Ta and Ti.

Copper damascene interconnect layer 15 is difficult to be entirely embedded in interconnect trench 10 because of decrease in width of interconnect trench 10. For example, in nonvolatile semiconductor memories such as flash memories, the width of interconnect trench 10 may be 10 nm or less.

Copper damascene interconnect layer 15 is formed by depositing a copper seed (Cu-seed) layer in interconnect trench 10 by sputtering first, immersing the Cu-seed layer in a copper plating solution, and thereby plating the Cu-seed layer with copper. However, since the width of interconnect trench 10 is reduced, the Cu-seed layer covers the frontage of interconnect trench 10 or the frontage of interconnect trench 10 becomes very small in sputtering for forming the Cu-seed layer, and a closed void is formed in the Cu-seed layer.

In such a case, the copper plating solution cannot sufficiently enter the closed void, and the copper plating layer cannot be formed with a sufficient thickness in the void. As a result, thereafter, when copper damascene interconnect layer 15 formed of the Cu-seed layer and the copper plating layer is formed in interconnect trench 10 by chemical mechanical polishing (CMP), concave portion 16 is formed in an upper portion of copper damascene interconnect layer 15.

In the present embodiment, stable and low-resistance graphene layer 17 covers an internal surface of concave portion 16 of copper damascene interconnect layer 15. Specifically, graphene layer 17 performs electronic conduction in a part where concave portion 16 is formed, and thereby problems such as increase in interconnect resistance caused by concave portion 16, decrease in reliability due to stress migration and electromigration, and discontinuity due to generation of Joule heat are solved, and high reliability is obtained.

In addition, graphene layer 17 can be grown with copper damascene interconnect layer 15 used as catalyst. Therefore, it is possible to easily form a composite interconnect which is formed of copper damascene interconnect layer 15 and graphene layer 17.

As illustrated in FIG. 4, graphene layer 17 is formed of one or more graphene sheets 17-1, 17-2, . . . , 17-n. Each of graphene sheets 17-1, 17-2, . . . , 17-n is a basic unit which performs ballistic conduction, is very thin (about 0.34 nm) and has low resistance. In embodiments, it suffices that graphene layer 17 is formed of at least one graphene sheet.

Since graphene layer 17 is grown with copper damascene interconnect layer 15 used as catalyst, graphene layer 17 is also formed on copper damascene interconnect layer 15 other than the concave portion 16 such as a top of the interconnect layer 15 as shown in FIG. 3, and an upper edge of the interconnect layer. One or more graphene sheets which form graphene layer 17 extend from copper damascene interconnect layer 15 in concave portion 16 to other parts of copper damascene interconnect layer 15 other than concave portion 16.

Contact plug 18 connects semiconductor devices, such as transistors and capacitors, which are formed on the semiconductor substrate to copper damascene interconnect layer 15.

According to the first embodiment, graphene layer 17 which covers the internal surface of concave portion 16 of copper damascene interconnect layer 15, and thereby it is possible to suppress increase in interconnect resistance in concave portion 16. In addition, since graphene layer 17 serves as an electronic conduction path, it is possible to reduce increase in current density in concave portion 16, and realize suppression of electromigration and prevention of discontinuity due to Joule heat. Besides, since graphene layer 17 has very high resistance to current density, it is possible to further increase current density resistance by using graphene layer 17 as a continuous interconnect layer (electronic conduction path) which extends from concave portion 16 to the outside of concave portion 16.

In addition, copper or copper alloy is easily deformed by stress. In particular, resistance to stress migration of copper damascene interconnect layer 15 decreases in concave portion 16 of copper damascene interconnect layer 15. According to the present embodiment, the internal surface of concave portion 16 is covered with a graphene layer which has a stable structure, and thus failure due to stress migration in concave portion 16 is prevented.

Graphene layer 17 is also formed on copper damascene interconnect layer 15 other than concave portion 16. Since graphene layer 17 continuously extends from the inside of concave portion 16 to the outside of concave portion 16, interconnect resistance of graphene layer 17 can be reduced smaller than that of copper damascene interconnect layer 15, by using graphene layer 17 as interconnect layer (electronic conduction path) like copper damascene interconnect layer 15.

Forming graphene layer 17 also on copper damascene interconnect layer 15 other than concave portion 16 is effective for preventing electromigration caused in an upper surface (interface between the copper damascene interconnect layer and the insulating layer) of copper damascene interconnect layer 15. This is because graphene layer 17 is a stable material which has very high resistance to heat and very high mechanical strength.

Since graphene layer 17 covers the upper surface of copper damascene interconnect layer 15 and the whole internal surface of concave portion 16, graphene layer 17 also serves as a protective layer which prevents oxidation of copper damascene interconnect layer 15.

Figure 5:
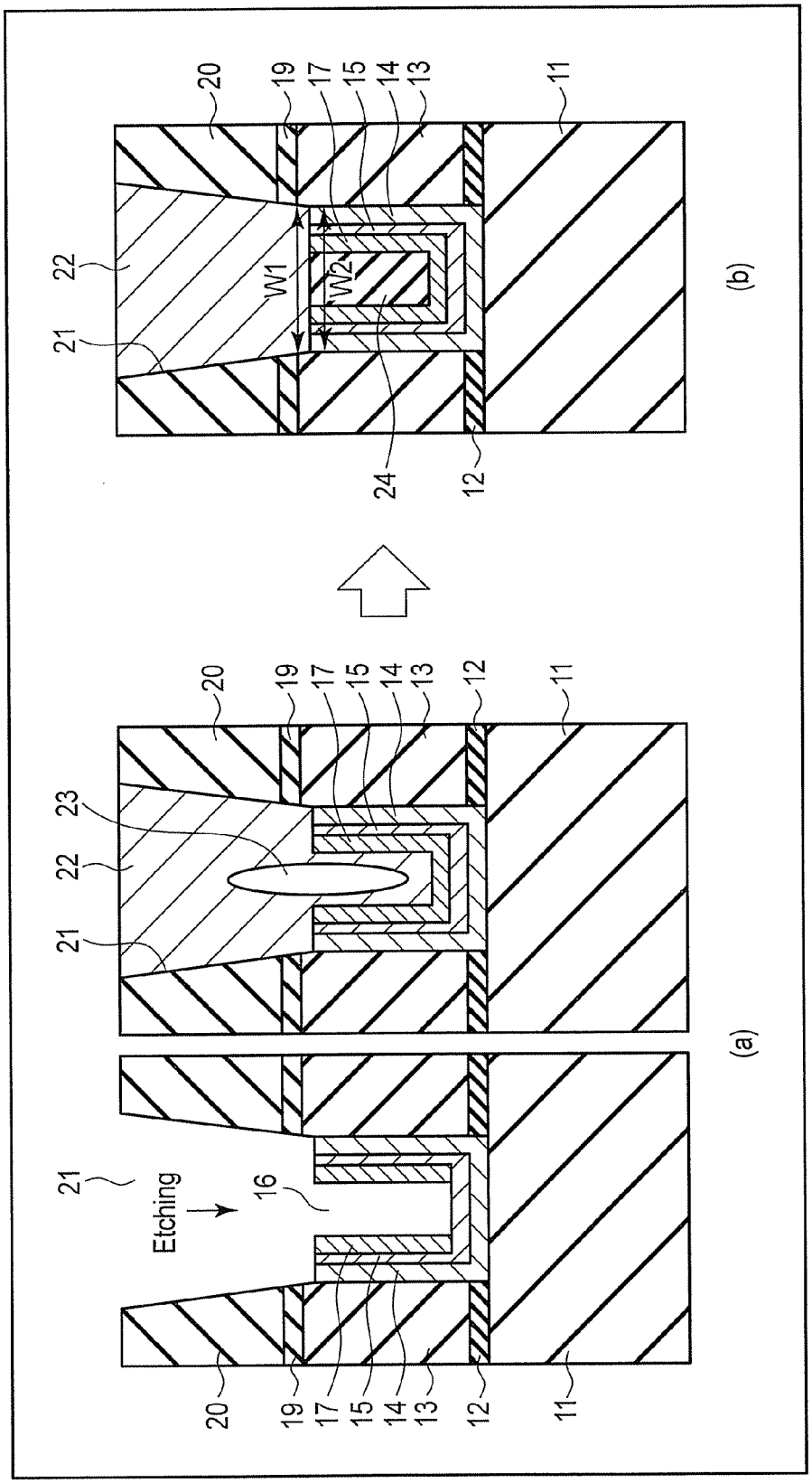
FIG. 5 is a diagram illustrating a contact plug on a concave portion of a copper damascene interconnect layer.

FIG. 5 illustrates the copper damascene interconnect layer and the contact plug which is connected to the copper damascene interconnect layer.

In the device illustrated in FIG. 1 to FIG. 3, when contact plug 22 is connected onto concave portion 16, two problems occur.

One problem is that graphene layer 17 which exists on a bottom surface of concave portion 16 is also removed, when insulating layer 19 and interlayer insulating layer 20 serving as etching stoppers are formed in or on concave portion 16 and contact hole 21 is formed in the insulating layers, as illustrated in a left part of FIG. 5(a).

This is caused by concave portion 16 which is left as cavity when insulating layer 19 and interlayer insulating layer 20 are formed. Graphene layer 17 is removed through the cavity in etching (RIE) for forming contact hole 21. In this case, graphene layer 17 which covers the internal surface of concave portion 16 of copper damascene interconnect layer 15 is reduced, and thus there is the possibility that the effect obtained by the above first embodiment is not sufficiently obtained.

The other problem is that concave portion 16 of copper damascene interconnect layer 15 is left in a bottom part of contact hole 21 even when graphene layer 17 is not removed by the etching, and thus new cavity 23 is formed when contact plug 22 is formed thereafter, as illustrated in a right part of FIG. 5(a).

Cavity 23 causes failure in embedding of contact plug 22, and may cause increase in contact resistance between copper damascene interconnect layer 15 and contact plug 22, and discontinuity between them.

Therefore, as illustrated in FIG. 5(b), the second embodiment proposes a structure in which a concave portion of copper damascene interconnect layer 15 is filled with insulating layer 24, when contact plug 22 to be connected to copper damascene interconnect layer 15 is formed on copper damascene interconnect layer 15.

When the concave portion is filled with insulating layer 24, graphene layer 17 is protected by insulating layer 24, and thus graphene layer 17 is not removed by etching for forming the contact hole. In addition, since no concave portion (cavity) of copper damascene interconnect layer 15 exists in the bottom part of contact hole 21, a possibility for generating a new cavity is reduced when contact plug 22 is formed thereafter.

Therefore, a failure in embedding of contact plug 22 is reduced, and thus problems such as increase in contact resistance between copper damascene interconnect layer 15 and contact plug 22 and discontinuity between them are reduced.

However, in this case, it is required that contact plug 22 connects with an in-plane end portion of at least one graphene sheet forming layer 17. This is because an in-plane end portion of the graphene sheet serves as a starting point or an end point of ballistic conduction.

To surely bring contact plug 22 into contact with graphene layer 17, it suffices that, for example, a width W1 of a lower end of contact plug 22 is set greater than or equal to a width W2 of an upper end of the interconnect trench. Even when width W1 of the lower end of contact plug 22 is less than width W2 of the upper end of the interconnect trench, the effect of the present embodiment can be obtained when contact plug 22 connects with graphene layer 17.

As long as contact plug 22 connects with graphene layer 17, contact plug 22 may simultaneously contact other layers, such as barrier metal layer 14, copper damascene interconnect layer 15, and insulating layer 24.

Insulating layer 19 serving as etching stopper may also be used as insulating layer 24, when it is formed of a material of good filling property, which can fill the concave portion of copper damascene interconnect layer 15. In this case, insulating layer 19 which serves as etching stopper is filled into the concave portion of the copper damascene interconnect layer, as insulating layer 24.

The material of insulating layer 24 may be the same as, or different from, the material of interlayer insulating layer 20. For example, insulating layer 24 can be formed of SiN, SiCN, or SiON, and interlayer insulating layer 20 can be formed of TEOS.

FIG. 6 illustrates a device according to the second embodiment. FIG. 7 is a cross-sectional view taken along line VII-VII of FIG. 6, and FIG. 8 is a cross-sectional view taken along line VIII-VIII of FIG. 6.

Figure 8:
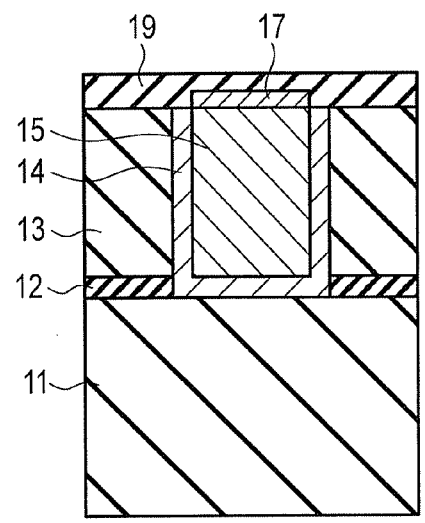
FIG. 8 is a cross-sectional view taken along line VIII-VIII of FIG. 6.

In this embodiment, a single interconnect which extends in a direction, has a portion with a concave filled with insulating layer 19 as in FIG. 7, and a portion without a concave as in FIG. 8.

FIG. 7 illustrates an area where a void in a damascene interconnect structure is formed, and FIG. 8 illustrates a normal area (area where no voids are formed) in the damascene interconnect structure.

In this embodiment, since graphene layer 17 does not fill concave portion 16 of copper damascene interconnect layer 15, insulating layer 19 which fills concave portion 16 is formed on graphene layer 17. In the present embodiment, insulating layer 19 also functions as an etching stopper, and formed on a top of insulating layer 13, barrier metal layer 14, interconnect layer 15, concave portion 16 and graphene layer 17.

Since graphene layer 17 is grown with copper damascene interconnect layer 15 used as a catalyst, graphene layer 17 is also formed on copper damascene interconnect layer 15 other than concave portion 16. One or more graphene sheets which form graphene layer 17 extends from copper damascene interconnect layer 15 in concave portion 16 to copper damascene interconnect layer 15 outside concave portion 16.

Contact plug 18 connects semiconductor devices such as transistors and capacitors formed on the semiconductor substrate to copper damascene interconnect layer 15.

Figure 9:
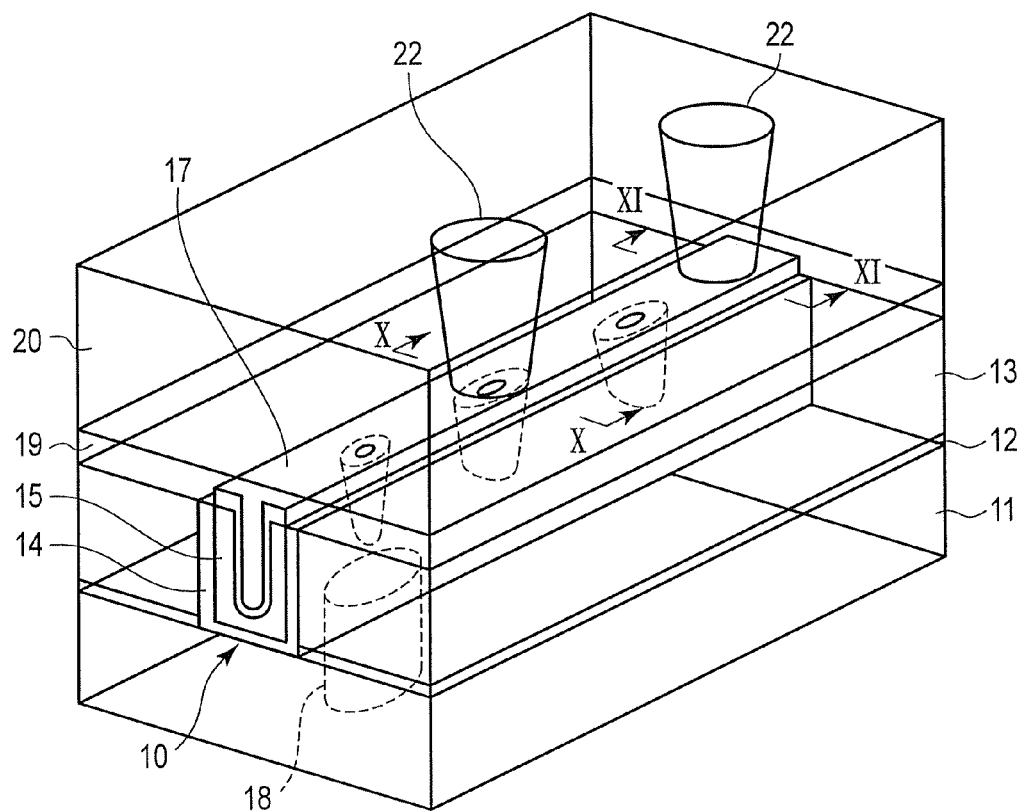
FIG. 9 is a perspective view of the device of the second embodiment.

FIG. 9 illustrates a structure in which contact plugs are added to the device of FIG. 6. FIG. 10 is a cross-sectional view taken along line X-X of FIG. 9, and FIG. 11 is a cross-sectional view taken along line XI-XI of FIG. 9.

FIG. 10 corresponds to FIG. 7, and illustrates an area where a void is formed in a damascene interconnect structure. FIG. 11 corresponds to FIG. 8, and illustrates a normal area (area where no voids are formed) in the damascene interconnect structure.

Interlayer insulating film 20 is formed on insulating layer 19 which fills the concave portion. Contact holes 21 are formed in interlayer insulating layer 20 and insulating layer 19, and contact plugs 22 are formed in respective contact holes 21.

Contact plug 22 connects with an in-plane end portion of at least one graphene sheet which forms graphene layer 17.

For example, as shown in FIG. 10, on the concave portion of copper damascene interconnect layer 15, contact plug 22 connects with an in-plane end portion of at least one graphene sheet which forms graphene layer 17 in the concave portion.

Figure 12:
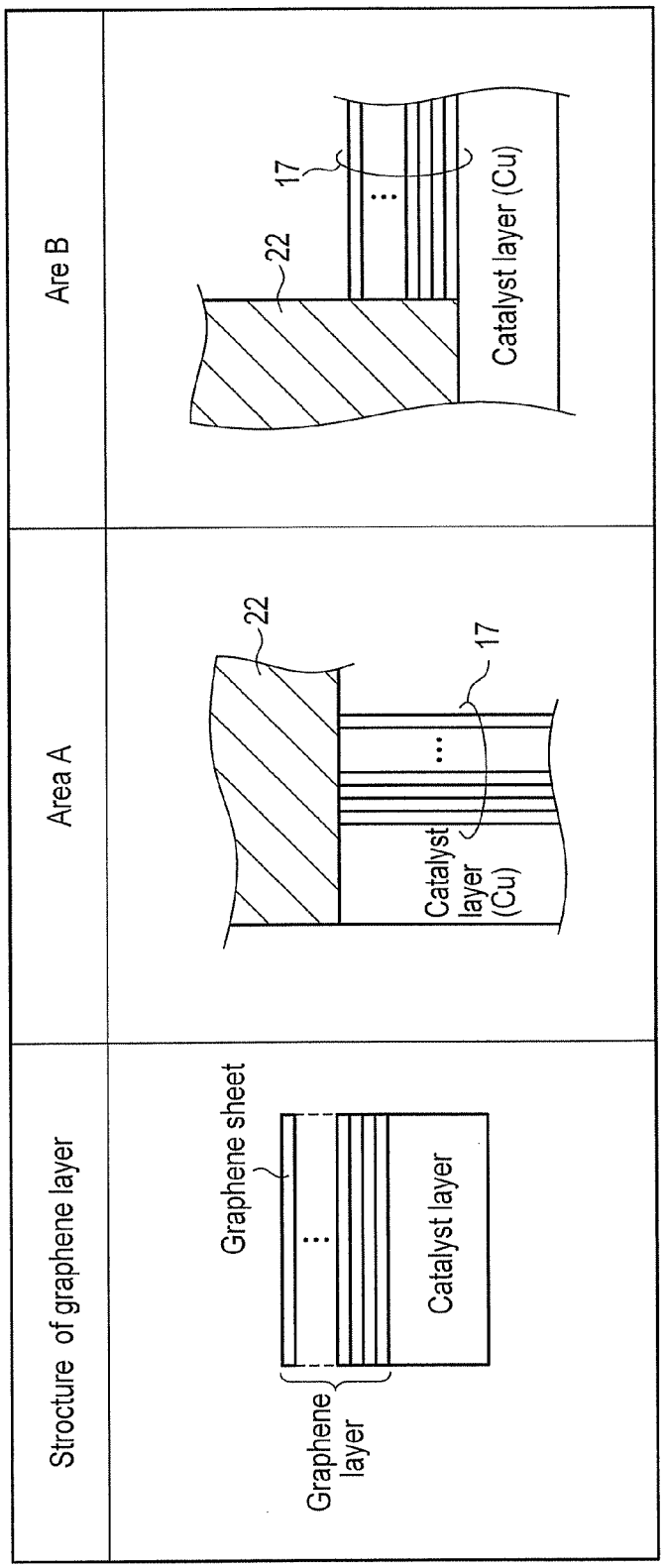
FIG. 12 is a diagram illustrating a contact state of a contact plug and a graphene layer.

FIG. 12 illustrates details of area A in FIG. 10. Graphene layer 17 is formed of, for example, 1 to 10 graphene sheets, and contact plug 22 connects with in-plane end portions of the graphene sheets.

In addition, as shown in FIG. 11, on copper damascene interconnect layer 15 other than the concave portion, contact plug 22 connects with an in-plane end portion of at least one graphene sheet which form graphene layer 17 on copper damascene interconnect layer 15.

FIG. 12 illustrates details of area B of FIG. 11. The contact hole is formed to penetrate graphene layer 17, and thereby contact plug 22 connects with an in-plane end portion of the graphene sheet.

According to the second embodiment, the concave portion of copper damascene interconnect layer 15 is filled with insulating layer 19. Therefore, graphene layer 17 is protected by insulating layer 19, and thus graphene layer 17 is not removed in etching for forming the contact holes.

In addition, since a generation of concave portion of copper damascene interconnect layer 15 in bottom portions of contact holes 21 is prevented, a generation of a new cavity is prevented when contact plugs 22 are formed.

Therefore, a failure in embedding of contact plugs 22 is prevented, and there are no problems such as increase in contact resistance between copper damascene interconnect layer 15 and contact plugs 22 and discontinuity between them.

Figure 13:
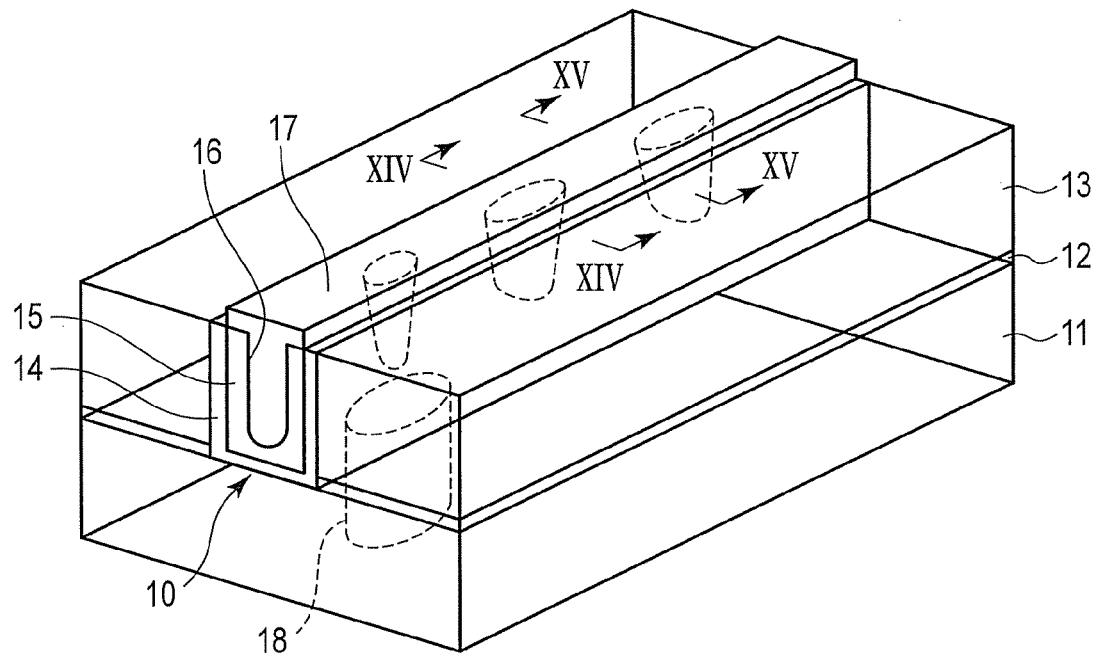
FIG. 13 is a perspective view illustrating a device of a third embodiment.
Figure 14:
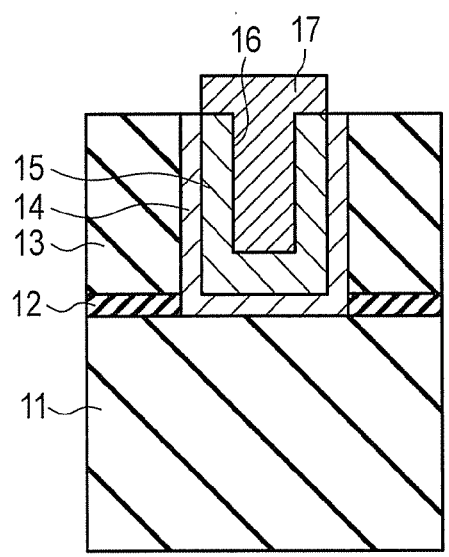
FIG. 14 is a cross-sectional view taken along line XIV-XIV of FIG. 13.

FIG. 13 illustrates a device according to a third embodiment. FIG. 14 is a cross-sectional view taken along line XIV-XIV of FIG. 13, and FIG. 15 is a cross-sectional view taken along line XV-XV of FIG. 13.

Figure 15:
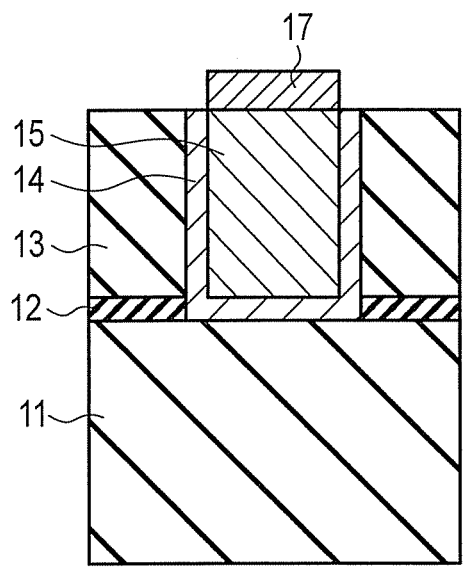
FIG. 15 is a cross-sectional view taken along line XV-XV of FIG. 13.

In this embodiment, a single interconnect which extends in a direction, has a portion with a concave portion filled with graphene layer 17 as in FIG. 14, and a portion without a concave portion as in FIG. 15.

FIG. 14 illustrates an area where a void is formed in a damascene interconnect structure, and FIG. 15 illustrates a normal area (area where no void is formed) in the damascene interconnect structure.

In the second embodiment, since the concave portion of copper damascene interconnect layer 15 is not entirely filled with graphene layer 17, insulating layers 19 and 24 which have good filling property and entirely fill the concave portion of copper damascene interconnect layer 15 are formed on graphene layer 17. In comparison with this, the present embodiment proposes a structure of entirely filling the concave portion of copper damascene interconnect layer 15 by graphene layer 17, and obtaining the same effect as that of the second embodiment.

In this embodiment, since graphene layer 17 entirely fills concave portion 16 of copper damascene interconnect layer 15, graphene layer 17 in concave portion 16 is not removed in etching for forming contact holes on copper damascene interconnect layer 15. Besides, since there is no concave portion (cavity) of copper damascene interconnect layer 15, no new cavity is formed when contact plugs are formed thereafter.

According to the third embodiment, graphene layer 17 entirely fills concave portion 16 of copper damascene interconnect layer 15, and thus graphene layer 17 in concave portion 16 is not removed in etching for forming contact holes on copper damascene interconnect layer 15, in the same manner as the second embodiment. In addition, since a generation of copper damascene interconnect layer 15 including a concave portion and a new cavity is prevented when contact plugs are formed thereafter.

Therefore, a failure in embedding of contact plugs is prevented, and there are no problems such as increase in contact resistance between copper damascene interconnect layer 15 and contact plugs connected thereto, and discontinuity between them.

The third embodiment may be used in combination with the first or second embodiment. An interconnect layer used in a miniaturized device is made thinner and longer, and the interconnect width fluctuates. Thereby, the size of the concave portion formed in the interconnect layer also varies. In addition, there are various types of interconnect layers to be used for devices, such as wide interconnect layers and narrow interconnect layers. The size of the concave portion formed in the interconnect layer also varies according to the type of the interconnect layer. Therefore, it is possible that a concave portion of a small size is filled with the graphene layer, and a concave portion of a large size is not filled with the graphene layer alone.

The present embodiment can be regarded as being effective also for the above structure, since the basic effect (the effect obtained by the first embodiment) of the present embodiment can be obtained also in the above structure. However, it is possible to fill all concave portions with the graphene layer, regardless of the size of the concave portions, by controlling the number of graphene sheets which form the graphene layer.

Figure 16:
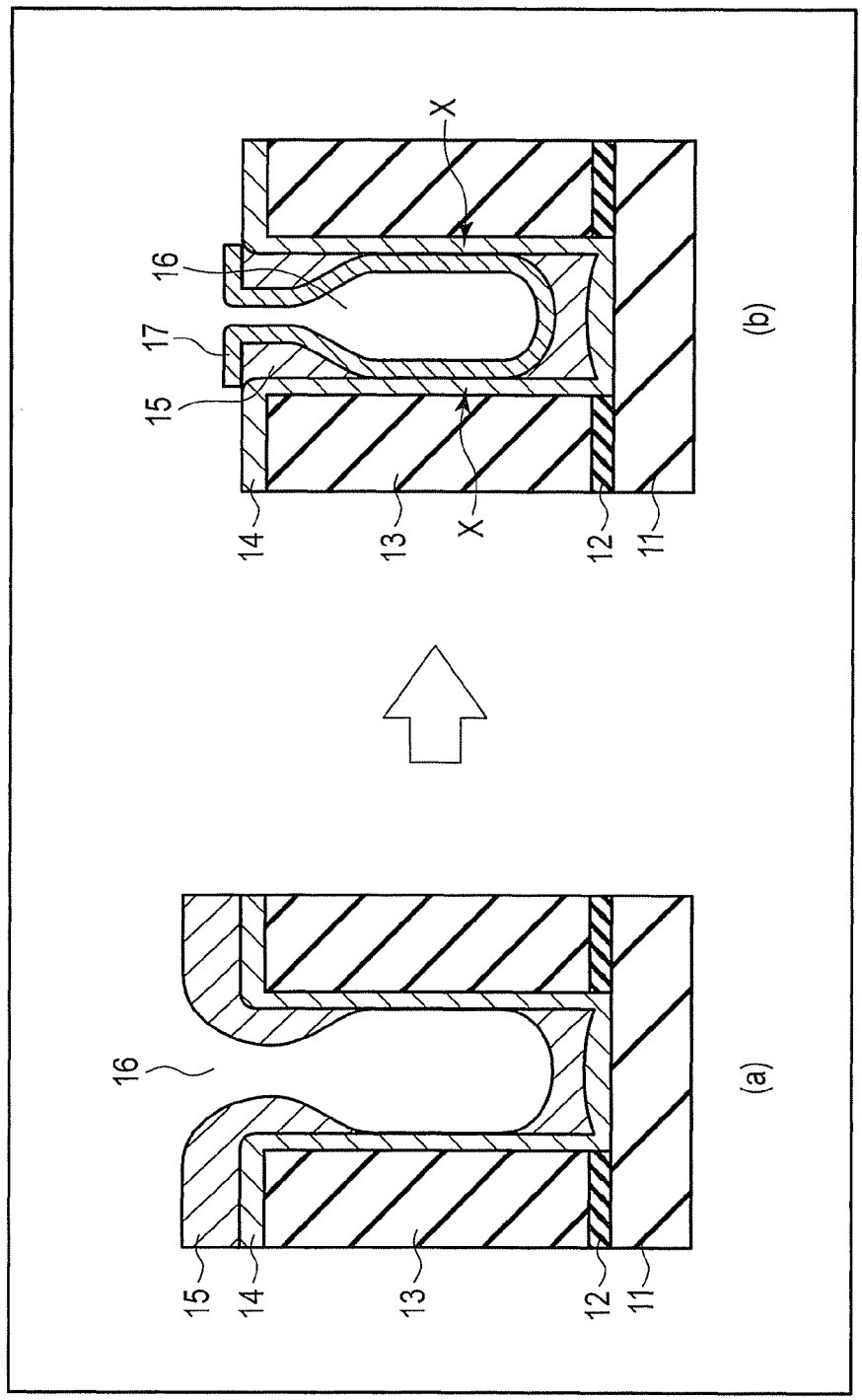
FIG. 16 is a cross-sectional view illustrating a device of a fourth embodiment.

FIG. 16 illustrates a device according to a fourth embodiment.

When the device (LSI) is miniaturized and the interconnect width is further reduced, there are cases where copper damascene interconnect layer 15 does not cover part of barrier metal layer 14, as illustrated in FIG. 16(a). When such a situation occurs, it is difficult to form a graphene layer on a whole internal surface of concave portion 16 of copper damascene interconnect layer 15. This is because a graphene layer is grown with copper damascene interconnect layer 15 used as a catalyst.

Therefore, in the fourth embodiment, barrier metal layer 14 is formed of a material which can be used as catalyst of the graphene layer. However, barrier metal layer 14 is required to have a function of preventing diffusion of the element which forms copper damascene interconnect layer 15.

The present embodiment proposes cobalt (Co) or cobalt alloy, as a material which prevents diffusion of the element that forms copper damascene interconnect layer (copper or copper alloy) 15 and can be used as catalyst of the graphene layer. Specifically, barrier metal layer 14 includes cobalt.

According to the above structure, even when copper damascene interconnect layer 15 does not cover part of barrier metal layer 14 in concave portion 16, barrier metal layer 14 which includes cobalt and copper damascene interconnect layer 15 serve as catalyst of the graphene layer, graphene layer 17 can be formed on the whole internal surface of concave portion 16 of copper damascene interconnect layer 15, as illustrated in FIG. 16(b).

The fourth embodiment is applicable to the barrier metal layers of the first to third embodiments.

FIG. 17 to FIG. 19 illustrate a device according to a fifth embodiment.

Devices (LSIs) generally include various types of copper damascene interconnect layers having different interconnect widths. Specifically, it is possible that the above concave portion is formed in a copper damascene interconnect layer having a small interconnect width, and the above concave portion is not formed in a copper damascene interconnect layer having a large interconnect width.

The example of FIG. 17 relates to the structure of the first embodiment (FIG. 2 and FIG. 3), and illustrates a state where copper damascene interconnect layer 15 (left side) which includes a concave portion and normal copper damascene interconnect layer 15 (right side) which entirely fills the interconnect trench exist together in a device.

In the normal part, a lower end of graphene layer (at least one graphene sheet) 17 is higher than an upper end of the interconnect trench.

The example of FIG. 18 relates to the structure of the second embodiment (FIG. 7 and FIG. 8), and illustrates a state where copper damascene interconnect layer 15 (left side) which includes a concave portion and normal copper damascene interconnect layer 15 (right side) which entirely fills the interconnect trench exist together in a device.

Also in the example, in the normal part, a lower end of graphene layer (at least one graphene sheet) 17 is higher than an upper end of the interconnect trench.

The example of FIG. 19 relates to the structure of the third embodiment (FIG. 14 and FIG. 15), and illustrates a state where copper damascene interconnect layer 15 (left side) which includes a concave portion and normal copper damascene interconnect layer 15 (right side) which entirely fills the interconnect trench exist together in a device.

Also in the example, in the normal part, a lower end of graphene layer (at least one graphene sheet) 17 is higher than an upper end of the interconnect trench.

FIG. 20 to FIG. 27 illustrate a method of manufacturing the device according to the second embodiment. The structure of the second embodiment which has the largest number of constituent elements will be explained hereinafter. Manufacturing methods of the structures according to the first, third, fourth, and fifth embodiments can be easily realized by applying the following manufacturing method of the structure of the second embodiment.

First, as illustrated in FIG. 20, a semiconductor substrate, on which semiconductor devices such as transistor capacitors are formed, is covered with an insulating layer, and lower interconnect layer 25 is formed on the insulating layer. Thereafter, interlayer insulating film 11 is formed on lower interconnect layer 25, and contact plugs 18 which reach lower interconnect layer 25 are formed in interlayer insulating layer 11.

Although the present example shows the case where contact plugs 18 are connected to lower interconnect layer 25, contact plugs 18 may be directly connected to the semiconductor substrate, or transistors or capacitors on the semiconductor substrate.

Interlayer insulating layer 11 is formed of an oxide layer including silicon, such as TEOS, and contact plugs 18 are formed of a simple metal layer such as W, Cu, and Al. A barrier metal layer may be formed as an underlayer of contact plugs 18, for the purpose of preventing diffusion of the metal element which forms contact plugs 18. The barrier metal layer is formed of metal material such as Ta, Ti, Ru, Mn, and Co, or nitride or oxide thereof.

In the present example, contact plugs 18 are formed separately from a copper damascene interconnect layer (single damascene interconnect layer) explained later, which is formed above contact plugs 18. However, contact plugs 18 may be formed simultaneously with the copper damascene interconnect layer which is formed above contact plugs 18 (dual damascene interconnect layer).

Thereafter, etching stopper layer (such as silicon nitride layer) 12 is formed on interlayer insulating layer 11 by CVD or the like. Then, interlayer insulating layer (for example, an oxide layer including silicon such as TEOS) 13 is formed on etching stopper layer 12 by CVD.

Etching stopper layer 12 is formed of a material which has a large etching selection ratio to interlayer insulating layers 11 and 13. However, when interlayer insulating layer 11 and interlayer insulating layer 13 are formed of different materials, and etching selection ratio between them can be set large, etching stopper layer 12 can be omitted.

Next, as illustrated in FIG. 21, a resist pattern is formed on interlayer insulating layer 13 by a photoengraving process (PEP) or the like. When interlayer insulating layer 13 is etched by reactive ion etching (RIE) or the like with the resist pattern used as a mask, interconnect trenchs 10 which reach contact plugs 18 are formed in interlayer insulating layer 13.

In the etching, first, interlayer insulating layer 13 is etched under conditions under which interlayer insulating layer 13 is easily etched, and then etching stopper layer 12 is etched under conditions under which etching stopper layer 12 is easily etched, and thus the depth of interconnect trenchs 10 can be made uniform.

Thereafter, the resist pattern is removed.

Next, as illustrated in FIG. 22, barrier metal layer 14 is formed on interlayer insulating layer 13 and internal surfaces of interconnect trenchs 10. Barrier metal layer 14 is formed of a metal material which has a function of preventing diffusion of a copper element, for example, Ta with a thickness of about 5 nm. Barrier metal layer 14 can be formed by using a method such as PVD, CVD, and atomic layer deposition (ALD). Barrier metal layer 14 may be formed of a metal material such as Ti, Ru, Co, and Mn other than Ta, or a nitride or oxide thereof.

Thereafter, copper seed layer 15A which serves as a cathode of electroplating is formed on barrier metal layer 14. Copper seed layer 15A is generally formed of sputtering. This is because copper layers are difficult to form by CVD in respect of steam pressure.

It is known that coverage (film formation uniformity) of sputtering is lower than that of CVD. Therefore, when the width of interconnect trenchs 10 is small, for example, 10 nm or less, the film formation speed of copper is increased at the frontage of interconnect trenchs 10, and the film formation speed of copper is decreased in side surfaces of interconnect trenchs 10. Thereby, copper seed layer 15A is pinched off at the frontage of interconnect trenchs 10, and a void which has an upper portion closed by copper seed layer 15A is formed in interconnect trenchs 10.

Processing fluctuations in lithography and etching for forming interconnect trenchs 10 is also a cause of occurrence of a void. For example, even when copper seed layer 15A is formed under conditions (interconnect width and copper deposition method) of forming no voids in interconnect trenchs 10, the widths of interconnect trenchs 10 fluctuate because of the above processing fluctuations. Because of the fluctuations, the interconnect trench 10 includes parts where filling failure occurs and parts where no filling failure occurs.

The left part of FIG. 22 illustrates a state of filling failure in which a void is formed in interconnect trench 10 (a state of poor coverage), and the right part of FIG. 22 illustrates a state in which copper seed layer 15A is formed in interconnect trench 10 with good coverage.

Next, as illustrated in FIG. 23, a copper layer is superposed on copper seed layer 15A of FIG. 22 by electroplating, and thereby copper damascene interconnect layer 15 is formed. In this process, in a part which includes filling failure (left part of FIG. 23) having a void with a closed upper portion, plating solution cannot enter the void. As a result, the void is left in the part.

Even if the upper portion of the void is opened, when the width of the opening portion is small, the plating solution cannot sufficiently enter the void. Therefore, plating may not be performed to entirely fill the void, and the void may be left.

In comparison with this, in the normal part (right part of FIG. 23) where no filling failure occurs, the plating solution sufficiently fills interconnect trench 10, and thus the part is filled with copper damascene interconnect layer 15.

Next, as illustrated in FIG. 24, copper damascene interconnect layer 15 is polished by chemical mechanical polishing (CMP) or the like, and excessive copper damascene interconnect layer 15 on interlayer insulating layer 13 is removed. As a result, as illustrated in the left part of FIG. 24, concave portion 16 is formed in interconnect trench 10 in the part including filling failure. In comparison with this, copper damascene interconnect layer 15 which entirely fills interconnect trench 10 is formed in interconnect trench 10 in the normal part.

Next, as illustrated in FIG. 25, graphene layer 17 which is formed of at least one graphene sheet is formed by CVD, with copper damascene interconnect layer 15 used as catalyst.

As a result, as illustrated in the left part of FIG. 25, graphene layer 17 which does not fill concave portion 16 is formed on an internal surface of concave portion 16 in interconnect trench 10, that is, on copper damascene interconnect layer 15, in the part including filling failure. In this structure, graphene layer 17 may entirely fill concave portion 16. In such a case, the structure of the third embodiment is obtained.

In comparison with this, as illustrated in the right part of FIG. 25, graphene layer 17 is formed on copper damascene interconnect layer 15 in interconnect trench 10, in the normal part.

As carbon source used for forming graphene layer 17 by CVD, hydrocarbon-based gas such as methane and acetylene or a mixture gas thereof is used, and hydrogen or rare gas is used as carrier gas. The number of graphene sheets which forms graphene layer 17 preferably falls within a range of 1 to 10. The number of graphene sheets is preferably as small as possible from the viewpoint of preventing interference between sheets, and may be 1.

Next, as illustrated in FIG. 26, etching stopper layer 19 is formed on interlayer insulating layer 13. In the present example, etching stopper layer 19 is used as insulating layer which fills the concave portion formed in the part including filling failure. Etching stopper layer 19 is formed of deposition such as ALD and heat CVD, to improve the performance for embedding the concave portion. Etching stopper layer 19 is formed of, for example, SiN having a fine structure.

Although in the present example etching stopper layer 19 is also used as insulating layer which fills the concave portion of the interconnect trench, an insulating layer only to fill the concave portion of the interconnect trench may be formed separately from etching stopper layer 19.

Thereafter, interlayer insulating layer 20 is formed on etching stopper layer 19.

Lastly, as illustrated in FIG. 27, a resist pattern is formed on interlayer insulating layer 20 by PEP, and contact holes 21 which reach copper damascene interconnect layer 15 are formed by RIE with the resist pattern used as mask.

To form contact holes 21, first, interlayer insulating layer 20 is etched under conditions under which interlayer insulating layer 20 is easily etched, and then etching stopper layer 19 is etched under conditions under which etching stopper layer 19 is easily etched. Therefore, the depths of contact holes 21 can be made uniform.

Thereafter, the resist pattern is removed.

Then, contact plugs 22 fill respective contact holes 21, and thereby the interconnect structure of the second embodiment is finished.

Contact plugs 22 are formed of a simple metal layer such as W, Cu, and Al, like contact plugs 18. In addition, contact plugs 22 may be provided with a barrier metal layer as an underlayer for the purpose of preventing diffusion of the metal element which forms contact plugs 22. The barrier metal layer is formed of a metal material such as Ta, Ti, Ru, Mn, and Co, or a nitride or oxide thereof.

The above is a process flow to realize the interconnect structure of each embodiment.

Figure 28:
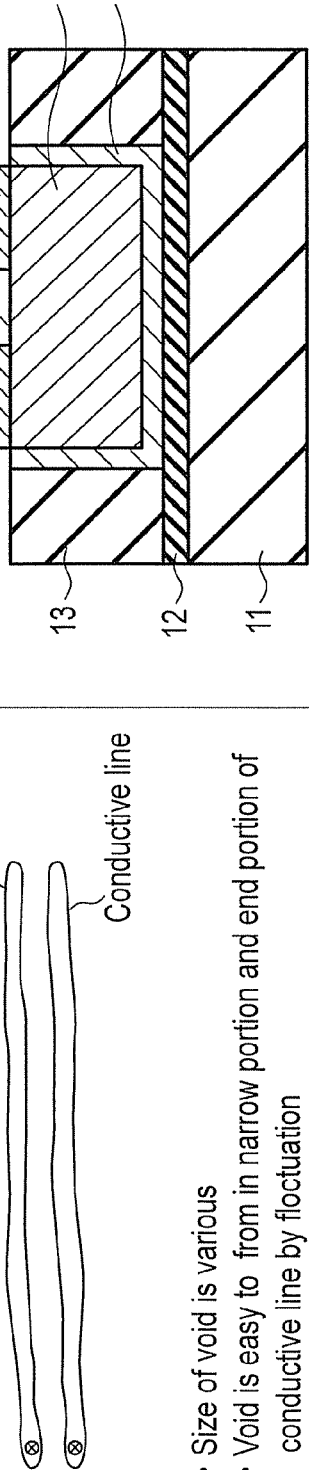
FIG. 28 is a diagram illustrating an example of application to a NAND flash memory.

FIG. 28 illustrates the case where the first to fifth embodiments are applied to a NAND flash memory.

Major constituent elements of a NAND flash memory is a memory cell array and a peripheral circuit (logic circuit). Because of increase in capacity of memory cell arrays, memory cell arrays are generally formed with a minimum processing size. For example, word lines or bit lines tend to be narrowed and lengthened. Word lines or bit lines may have different interconnect widths because of fluctuations. In addition, end portions of word lines or bit lines tend to be tapered, and contact portions for word lines or bit lines are provided on the end portions. Specifically, there are many cases where contact plugs are provided on concave portions of the copper damascene interconnect layer. Therefore, it is very effective to apply the second and third embodiments to word lines or bit lines of a NAND flash memory.

On the other hand, the peripheral circuit is provided with copper damascene interconnect layer 15 which has an interconnect width greater than that of word lines or bit lines in the memory cell array. Contact plugs 22 are connected to copper damascene interconnect layer 15 like this, such that contact plugs 22 penetrate graphene layer 17 on copper damascene interconnect layer 15, as explained in the first to third embodiments, since copper damascene interconnect layer 15 entirely fills the interconnect trenchs. By adopting the above structure, contact plugs 22 connect with an in-plane end portion of at least one graphene sheet which forms graphene layer 17, and thus it is possible to achieve reduction in resistance of copper damascene interconnect layer 15 in the peripheral circuit and improve reliability.

As described above, according to the embodiments, it is possible to provide an interconnect structure which can secure high reliability even when there is a void.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A device comprising:
a first insulating layer with a first trench;
a first interconnect layer in the first trench, the first interconnect layer including copper and a concave portion in the copper of the first interconnect layer; and
a first graphene sheet on an inner surface of the concave portion.

2. The device of claim 1, further comprising
a second interconnect layer in a second trench of the first insulating layer, the second interconnect layer including copper; and
a second graphene-sheet on the second interconnect layer, the second graphene sheet having a lower end higher than an upper end of the second trench.

3. The device of claim 1, further comprising
a second insulating layer formed in the concave portion of the first interconnect layer.

4. The device of claim 1,
wherein the concave portion is one of a void and a trench having a whisker shape.

5. The device of claim 1,
wherein the first trench extends in a direction, in a first cross sectional view taken along a plane perpendicular to the direction, the concave portion is in the copper of the first interconnect layer, and in a second cross sectional view other than the first cross sectional view taken along a plane perpendicular to the direction, the concave portion is not formed in the copper of the first interconnect layer.

6. The device of claim 1, further comprising:
a second insulating layer on the first graphene sheet, the second insulating layer filling the concave portion; and
a contact plug connecting with an end portion in an in-plane direction of the first graphene sheet,
wherein the first graphene sheet is provided on the first interconnect layer except the concave portion, and does not fill the concave portion.

7. The device of claim 6, further comprising
a second interconnect layer in a second trench of the first insulating layer, the second interconnect layer including copper; and
a second graphene-sheet on the second interconnect layer, the second graphene sheet having a lower end higher than an upper end of the second trench.

8. The device of claim 6,
wherein the concave portion is one of a void and a trench having a whisker shape.

9. The device of claim 1, further comprising:
a contact plug connecting with an end portion in an in-plane direction of the first graphene sheet,
wherein the first graphene sheet is provided on the first interconnect layer except the concave portion, and fills the concave portion.

10. The device of claim 9, further comprising
a second interconnect layer in a second trench of the first insulating layer, the second interconnect layer including copper; and
a second graphene-sheet on the second interconnect layer, the second graphene sheet having a lower end higher than an upper end of the second trench.

11. The device of claim 9,
wherein the first interconnect layer has a damascene interconnect structure.

12. The device of claim 9,
wherein the concave portion is one of a void and a trench having a whisker shape.

13. The device of claim 1, further comprising:
a barrier metal layer on an inner surface of the first trench, the barrier metal layer including cobalt and not filling the first trench,
wherein the first interconnect layer is provided on the barrier metal layer, and does not cover the barrier metal layer in a part in the concave portion.

14. The device of claim 13, further comprising
a second interconnect layer in a second trench of the first insulating layer, the second interconnect layer including copper; and
a second graphene-sheet on the second interconnect layer, the second graphene sheet having a lower end higher than an upper end of the second trench.

15. The device of claim 13,
wherein the concave portion is one of a void and a trench having a whisker shape.

* * * * *